(12) United States Patent
Blodgett et al.

(10) Patent No.: US 11,967,017 B2
(45) Date of Patent: Apr. 23, 2024

(54) TRANSPARENT, SEMI-TRANSPARENT, AND OPAQUE DYNAMIC 3D OBJECTS IN DESIGN SOFTWARE

(71) Applicant: DIRTT Environmental Solutions Inc., Salt Lake City, UT (US)

(72) Inventors: Robert Blodgett, Salt Lake City, UT (US); Paul Williams Mattson, Bluffdale, UT (US)

(73) Assignees: DIRTT ENVIRONMENTAL SOLUTIONS LTD., Calgary (CA); ARMSTRONG WORLD INDUSTRIES, INC., Lancaster, PA (US)

( * ) Notice: Subject to any disclaimer, the term of this patent is extended or adjusted under 35 U.S.C. 154(b) by 90 days.

(21) Appl. No.: 17/650,378

(22) Filed: Feb. 8, 2022

(65) Prior Publication Data

US 2022/0254098 A1 Aug. 11, 2022

Related U.S. Application Data

(60) Provisional application No. 63/148,316, filed on Feb. 11, 2021.

(51) Int. Cl.
| | |
|---|---|
| *G06T 15/00* | (2011.01) |
| *G06F 30/13* | (2020.01) |
| *G06T 11/00* | (2006.01) |
| *G06T 11/40* | (2006.01) |
| *G06T 15/40* | (2011.01) |
| *G06T 15/50* | (2011.01) |

(52) U.S. Cl.
CPC ............ *G06T 15/503* (2013.01); *G06F 30/13* (2020.01); *G06T 11/001* (2013.01); *G06T 11/40* (2013.01); *G06T 15/40* (2013.01)

(58) Field of Classification Search
CPC ..... G06T 15/503; G06T 11/001; G06T 11/40; G06T 15/40; G06T 2210/62; G06T 19/00; G06F 30/13
See application file for complete search history.

(56) References Cited

U.S. PATENT DOCUMENTS

| | | | | |
|---|---|---|---|---|
| 7,061,502 | B1* | 6/2006 | Law | G06T 15/503 |
| | | | | 345/592 |
| 9,576,393 | B1* | 2/2017 | Bethel | G06F 3/04815 |
| 10,482,607 | B1* | 11/2019 | Walters | G06F 16/2423 |
| 10,839,521 | B2* | 11/2020 | Sawai | H04N 7/18 |
| 2007/0257912 | A1* | 11/2007 | Repin | G06T 19/20 |
| | | | | 345/426 |
| 2017/0154454 | A1* | 6/2017 | Akahane | G06T 5/008 |
| 2019/0329133 | A1* | 10/2019 | Okamura | A63F 13/52 |
| 2020/0293767 | A1* | 9/2020 | Choi | G06V 20/52 |
| 2021/0312099 | A1* | 10/2021 | Apte | G06T 19/00 |

* cited by examiner

Primary Examiner — Michael Le
(74) Attorney, Agent, or Firm — Workman Nydegger

(57) ABSTRACT

A computing system, having stored thereon a design software, is configured to generate a design file representing a three-dimensional space that embodies a design. The computing system is further configured to render a three-dimensional view of the three-dimensional space in a graphical user interface. In response to receiving a user input of placing a three-dimensional object in the three-dimensional space, the computing system then renders the three-dimensional object in the three-dimensional view of the three-dimensional space in the graphical user interface as a silhouette.

16 Claims, 10 Drawing Sheets

TRANSPARENT, SEMI-TRANSPARENT, AND OPAQUE DYNAMIC 3D OBJECTS IN DESIGN SOFTWARE

CROSS-REFERENCE TO RELATED APPLICATIONS

This application claims the benefit of and priority to U.S. Provisional Patent Application Ser. No. 63/148,316 filed on Feb. 11, 2021, and entitled "TRANSPARENT, SEMI-TRANSPARENT, AND OPAQUE DYNAMIC 3D OBJECTS IN DESIGN SOFTWARE," which application is expressly incorporated herein by reference in its entirety.

BACKGROUND

Computer-aided design (CAD) programs can increase the productivity of the designers, improve the quality of designs, improve communications through documentation, and create data files for manufacturing. A CAD design is often in the form of computer-readable files that are sharable among colleagues and cooperating parties. Some CAD programs are configured to generate 3D models and render the generated 3D models in a graphical user interface.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

The embodiments described herein are related to a computing system, a method, and/or a computer program product for implementing a computer-aided design (CAD) software configured to render a three-dimensional (3D) object as a silhouette in a 3D view of a 3D space. A silhouette described herein is an image of a 3D object represented as a shape of one or more colors, which may or may not have an outline that has a different color than the interior of the shape, which may be filled with a single color, multiple colors, and/or any patterns, which may be transparent, semi-transparent, or opaque, and in which there may or may not be sketch lines.

The computing system is configured to generate a design file representing a 3D space that embodies a design. The computing system is also configured to render a 3D view of the 3D space in a graphical user interface (GUI). The computing system is also configured to receive a user input, placing a 3D object in the 3D space, and render the 3D object in the 3D view of 3D space in the GUI as a silhouette. In some embodiments, the 3D object may be a character, such as a person, a pet, etc. In some embodiments, the 3D object may be a fixture (such as a wall, a window, etc.) or a non-fixture (such as a furniture piece, a chair, a table, etc.).

In some embodiments, the silhouette (also referred to as a first silhouette) is rendered as a silhouette having a particular opacity level. Opacity level is often defined as a percentage number between 0% and 100%. 100% opacity means the contents of the layer are completely opaque, 0% opacity means completely transparent, and any percentage of opacity in between means semi-transparent. In some embodiments, rendering the 3D object as the silhouette having the particular opacity includes performing color blending (such as, but not limited to, alpha blending) to combine a color of the silhouette with colors of an area of the 3D view of the 3D space that overlaps the silhouette to create an appearance of partial or full transparency. As such, the silhouette does not completely block any feature of the design in the 3D space, and all features of the design in the three-dimensional space can be at least partially seen through the silhouette.

In some embodiments, the computing system is further configured to receive another user input to place a second object in the 3D space and render the second object in the 3D view of the 3D space as a second silhouette that has a second particular opacity. In some embodiments, when the second silhouette at least partially overlaps the first silhouette in the 3D view, the computing system further performs color blending (such as, but not limited to, alpha blending) in an overlapping area among the first silhouette, the second silhouette, and the 3D space to create an appearance of partial or full transparency, such that neither the first silhouette nor the second silhouette completely blocks any feature of the design in the 3D space, and all the features of the design in the 3D space can be at least partially seen through the first silhouette and the second silhouette.

In some embodiments, the computing system is further configured to receive another user input, changing at least one of a plurality of properties of the silhouette and re-render the 3D object in the 3D view of the 3D space based on the second user input. The plurality of properties of the silhouette includes (but are not limited to) (1) a color of an outline of the silhouette, (2) a weight of an outline of the silhouette, (3) a color filling in the silhouette, (4) an opacity level of an outline of the silhouette, and/or (5) an opacity level of a color filling in the silhouette.

In some embodiments, the silhouette further includes a shadow mode and a no-shadow mode. When the silhouette is in the shadow mode, the computing system is further configured to render a shadow of the silhouette based on lighting and depth of each surface where the shadow overlaps in the 3D view. When the silhouette is in a no-shadow mode, no shadow of the silhouette is rendered.

In some embodiments, the silhouette further includes an animated mode or a fixed mode. When the silhouette is in the animated mode, the silhouette is an animated silhouette configured to perform a sequence of motions. In some embodiments, the silhouette is configured to perform a predetermined sequence of motion. In some embodiments, the animated silhouette is driven at runtime by external sensors mimicking the motions of a human actor. The human actor may be a user wearing one or more sensing devices configured to send sensing data to the computing system. The sensing data is associated with the user's motions. In response to receiving the sensing data, the computing system is configured to cause the animated silhouette to mimic the motions of the user. Alternatively, when the silhouette is in the fixed mode, the silhouette is fixed at a particular position in the 3D view of the 3D space, holding still.

In some embodiments, the silhouette further includes a sketch mode or a no-sketch mode. When the silhouette is in the sketch mode, the silhouette is rendered to include sketch lines inside the silhouette and an outline outlining the silhouette based on a shape of the object and lighting of the 3D space. When the silhouette is in the no-sketch mode, the silhouette is rendered to have no sketch lines inside the silhouette.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments that are illustrated in the appended drawings. Understanding that these drawings depict only typical embodiments and are not, therefore, to be considered to be limiting in scope, embodiments will be described and explained with additional specificity and details through the use of the accompanying drawings described below.

DETAILED DESCRIPTION

The embodiments described herein are related to a computing system, a method, and/or a computer program product for implementing a design software application configured to render a three-dimensional (3D) object as a silhouette in a 3D view of a 3D space. A silhouette described herein is an image of a 3D object represented as a shape of one or more colors, which may or may not have an outline that has a different color than the interior of the shape, which may be filled with a single color, multiple colors, images, textures, and/or any patterns, which may be transparent, semi-transparent, or opaque, and in which there may or may not be sketch lines. The images, textures, and/or any patterns may be pre-generated or generated dynamically in real-time.

The computer-aided design (CAD) software is stored at one or more computer-readable storage devices that are accessible by a computing system. When the CAD software is executed by the computing system, the computing system is configured to aid in the creation, modification, analysis, or optimization of a design. The CAD software can increase the productivity of the designers, improve the quality of designs, improve communications through documentation, and create data files for manufacturing.

Existing CAD software may allow a user to place a 3D object, such as an animated person, a furniture piece, in an environment to make the environment look more real and interesting. However, some users or viewers feel that such 3D objects are somewhat distracting because they block portions of the architectural design, or they draw attention away from the design itself. Embodiments disclosed herein render 3D objects as silhouettes having any particular opacity level. The silhouettes provide meaningful context as to the spatial size and location and available space for people within the environment but are not as distracting as full-colored 3D objects. In the case of semi-transparent silhouettes, there may also be an added benefit of seeing what's behind them. Although, depending on the design and/or the use case, there are also situations in which complete opaque silhouettes are preferred.

Figure 1:
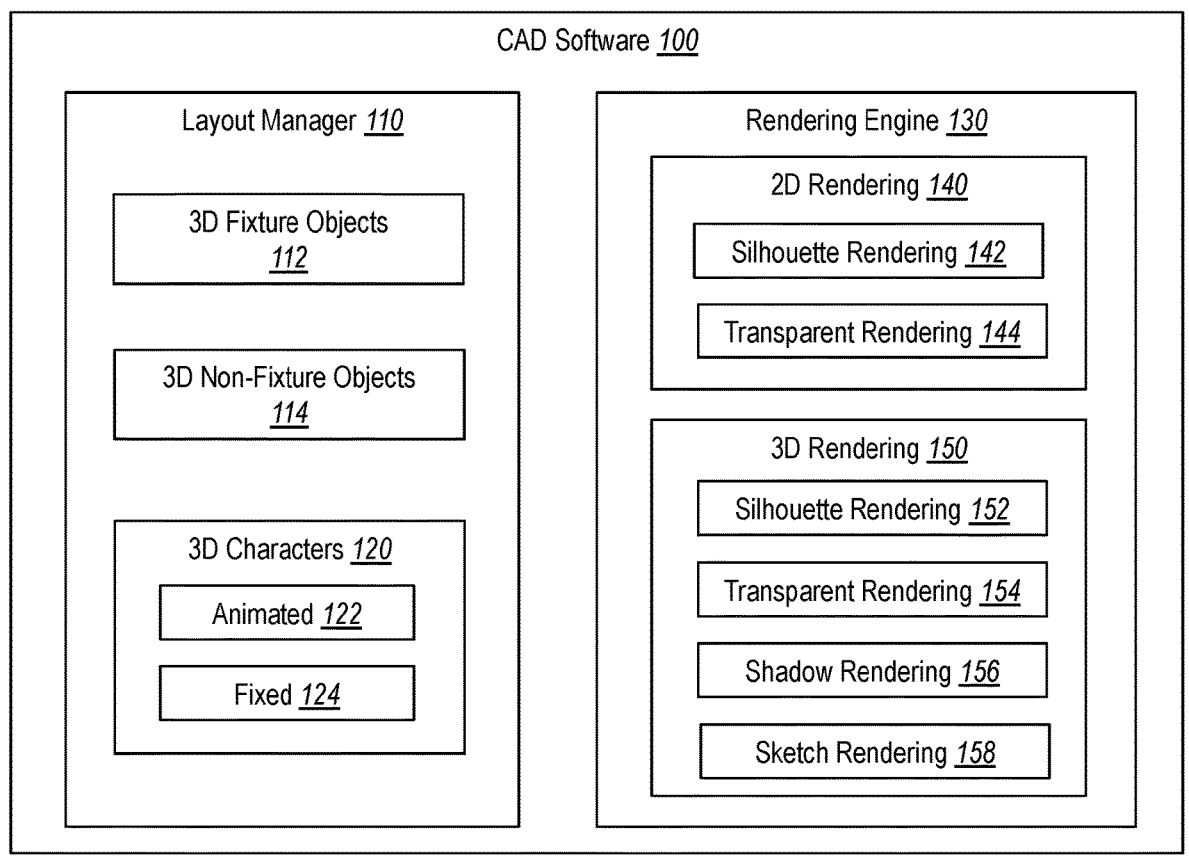
FIG. 1 illustrates a functional block diagram of a design software that implements the principles described herein.

FIG. 1 illustrates a functional block diagram of a CAD software 100 that implements the principles described herein. The CAD software 100 is configured to generate a design of a 3D space and render the 3D space that embodies the design in a graphical user interface (GUI). For example, a user can interact with the GUI of the CAD software 100 to create a design of a 3D space. The CAD software 100 is configured to store the design as a design file in a computer-readable storage device.

The CAD software 100 includes a layout manager 110 and a rendering engine 130. The layout manager 110 is configured to manage the layout of one or more graphical elements in the GUI. In some embodiments, the one or more graphic elements are selected from a set of 3D fixture objects 112, a set of 3D non-fixture objects 114, and a set of 3D characters 120, including animated characters 122 and fixed characters 124. A user can interact with the GUI to place any one of these 3D objects 112, 114, and 3D characters 120 in the 3D spaces.

The fixture objects 112 may include (but are not limited to) a wall, a window, a sink, flooring, a ceiling, etc. The non-fixture objects 114 may include (but are not limited to) various furniture pieces, such as a refrigerator, a table, a desk, a chair, a couch, a shelf, a curtain, a wall painting, etc. The characters 120 may include (but are not limited to) realistic and/or cartoonish persons of different ages, genders, roles, and/or shapes wearing different outfits and hairstyles. The characters 120 may also include (but are not limited to) realistic and/or cartoonish animals, such as a pet dog, a pet cat, etc.

In some embodiments, the animated characters 122 are configured to perform a sequence of motions in the 3D space. For example, in some embodiments, an sketch may be a realistic person configured to sit on a couch or a chair in the 3D space making random motions or making a predetermined sequence of motions, such as checking their phone, answering a call, reading a book, etc. As another example, in some embodiments, an animated character 122 may be a realistic person configured to walk around randomly in a predetermined area in the 3D space.

Alternatively, the animated characters 122 can also be driven at runtime by external sensors mimicking motions of human actors. For example, a user may be wearing a head-mounted device and/or holding a handset, configured to sense the user's location and motions. Based on the sensing data received from the head-mounted device and/or the handset, an animated character 122 may be rendered to mimic the motions of the user.

For example, a designer may wish to give a remote viewer a virtual tour of a design. The designer may select a desired animated character 122 as an avatar within the design. The avatar may be rendered as a semi-transparent silhouette such that the designer does not block any views within the 3D space and also so the designer does not distract from the design itself. The designer is able to make gestures and motions in the real world that are translated to the virtual design. These gestures and motions may function to direct the viewers' attention to particular aspects of the design. For instance, the designer may gesture towards a particular feature in the design. A viewer may then see the animated character perform this gesture towards the particular feature in the design.

In some embodiments, the designer may be physically located within the design space or within a purpose built simulation room. As the designer walks around the space, the avatar's silhouette similarly moves around the space and mimics the designer's gestures and motions.

The fixed characters 124 are configured to be placed at a particular position in the 3D space, holding still. In some embodiments, at least a portion of the characters 120 have an animated mode and a fixed mode that are selectable. For example, when a user selects the animated mode of a character of a person and places the character in a particular area of the 3D space, the character of the person is configured to perform a sequence of motions in the 3D space. In some embodiments, after selecting the fixed mode of the character, the user can further select a particular pose of the character, such as sitting still. When the character in the fixed mode is placed at a particular location in the 3D space, the character is configured to hold the particular pose at the particular location in the 3D space.

The rendering engine 130 is configured to render the design in one or more two-dimensional (2D) views or one or more 3D views in the GUI. For example, a 2D view may be a cross-sectional view, a top view, or a side view of the 3D space; and a 3D view may be a perspective view of the 3D space, such as a perspective view from a particular point at a particular angle. The rendering engine 130 includes a 2D rendering engine 140 and a 3D rendering engine 150. The 2D rendering engine 140 is configured to render the one or more 2D views of the 3D space in the GUI. The 3D rendering engine 150 is configured to render the one or more 3D views of the 3D space in the GUI. Further, the rendering engine 130 is configured to render some objects as silhouettes having particular opacities. In particular, in some embodiments, each of the 2D rendering engine 140 or the 3D rendering engine 150 further includes a silhouette rendering engine 142, 152, and a transparent rendering engine 144, 154.

The silhouette rendering engine 142 or 152 is configured to compute an outline of a 3D object and fill the outline of the 3D object with a same color. In at least one embodiment, the silhouette rendering engine 142 or 152 identifies an outline of the 3D object that is viewable to a viewer and creates the silhouette by rendering the outline. Further, in at least one embodiment, the rendering is performed such that different viewers who are viewing the 3D space from different perspectives all see unique views of the silhouette. For example, a first viewer may see a silhouette that represents a side view of the 3D object, while a second viewer may see a silhouette that represents a front view of the 3D object. Accordingly, in some embodiments, even though the silhouette appears to be a 2D image to each individual view, the actual silhouette is rendered, for each viewer, from the original 3D object, which allows each viewer to see a correct perspective view of the silhouette.

The transparent rendering engine 144, 154 is configured to compute a color of an object having a particular opacity that overlays a 2D view or a 3D view of the 3D space. In some embodiments, the transparent rendering engine 144, 154 is configured to perform color blending (such as, but not limited to, alpha blending) to combine a color of the silhouette with colors of an area of the 3D space that overlaps the silhouette to create an appearance of partial or full transparency. As such, the silhouette does not completely block any feature of the design in the 3D space, and all features of the design in the 3D space can be at least partially seen through the silhouette.

For example, a user can select one of the objects in the 3D space and select a silhouette mode or full 3D mode. When the user selects the silhouette mode, the object is rendered as a silhouette in the 3D space. Further, when an object is in the silhouette mode, the user can further change the properties of the silhouette, including (but not limited to) (1) a color of an outline of the silhouette, (2) a weight of an outline of the silhouette, (3) a color filling in the silhouette, (4) an opacity level of an outline of the silhouette, and/or (5) an opacity level of a color filling in the silhouette.

Further, in some embodiments, the silhouette may be in an animated mode or a fixed mode. When the silhouette is in the animated mode, the silhouette is an animated silhouette configured to perform a sequence of motions in the 3D space at a particular speed. When the silhouette is in the fixed mode, the silhouette is fixed at a particular position in the 3D space, holding still.

In some embodiments, the 3D rendering engine 150 further includes a shadow rendering engine 156 configured to compute a shape and color of a shadow of a silhouette based on lighting and depth of each surface where the shadow overlaps in the 3D space. A user can select a shadow mode or a no-shadow mode for a silhouette. When the shadow mode is selected for the silhouette, a shadow of the silhouette is rendered in the 3D view.

In some embodiments, the 3D rendering engine 150 further includes a sketch rendering engine 158 configured to compute sketch lines inside a silhouette based on a shape of the object and lighting of the three-dimensional space. A user can select a sketch mode or a no-sketch mode for a silhouette. When the sketch mode is selected for the silhouette, sketch lines inside the silhouette is rendered. Additionally or alternatively, the sketch mode may comprise an animated character 122 filled in with images, patterns, or textures of any opacity level that have a similar sketching mode applied to the outline. In some embodiments, the user can also make changes to the color of the sketch lines and/or the opacity of the sketch lines.

In some embodiments, the user can place as many silhouette objects in the 3D space as desired. When multiple silhouettes having different opacities are placed in the same 3D space, two or more of the silhouettes may overlap in certain views. For example, when a first silhouette at least partially overlaps a second silhouette in a particular view of the 3D space, the transparent rendering engine 144 or 154 further performs color blending (such as, but not limited to, alpha blending) in an overlapping area among the first silhouette, the second silhouette, and the 3D space to create an appearance of full opaque, partial or full transparency.

Figure 2:
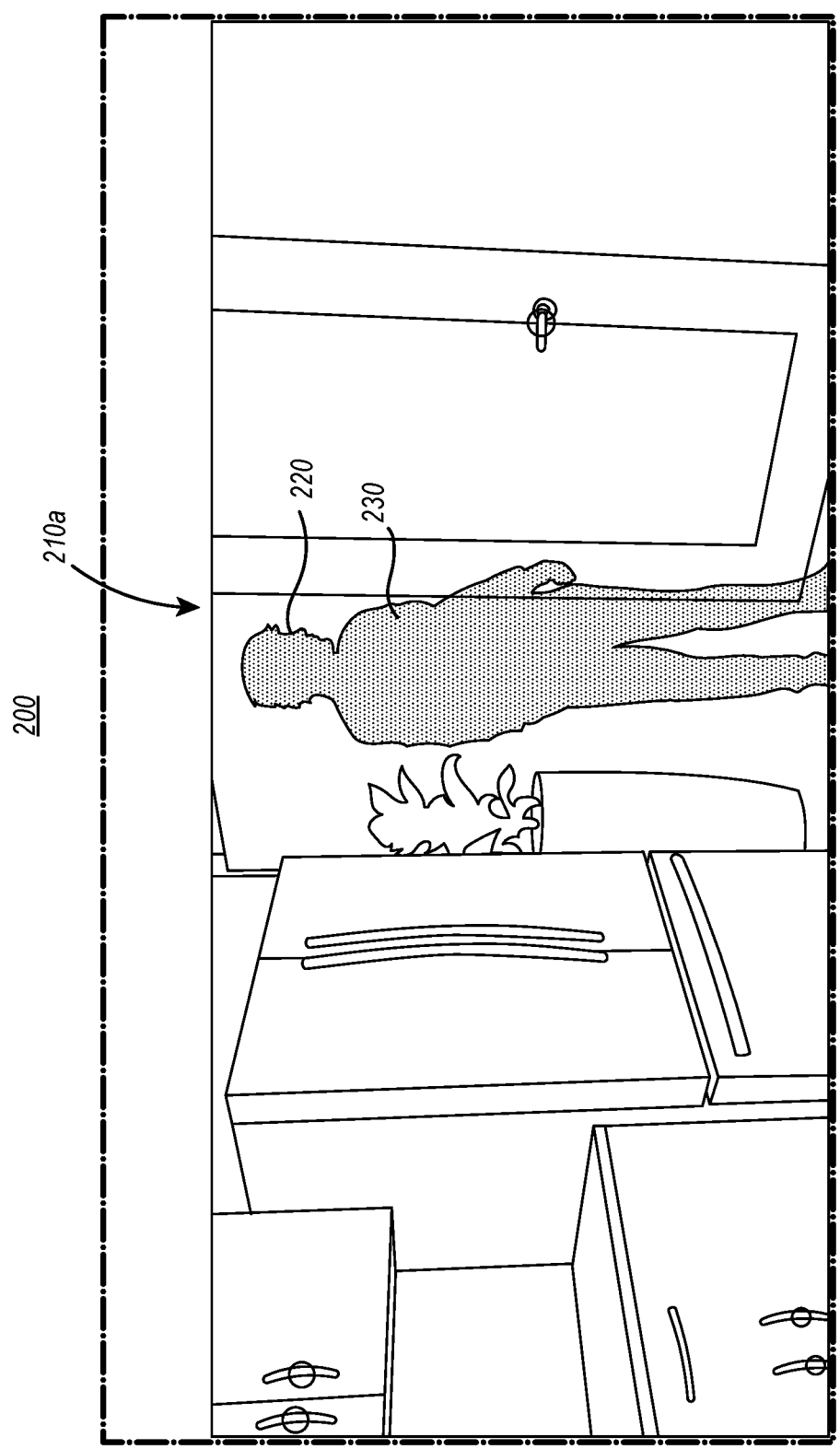
FIG. 2 illustrates a 3D view of an environment, in which an animated character is rendered as a semi-transparent silhouette.
Figure 3:
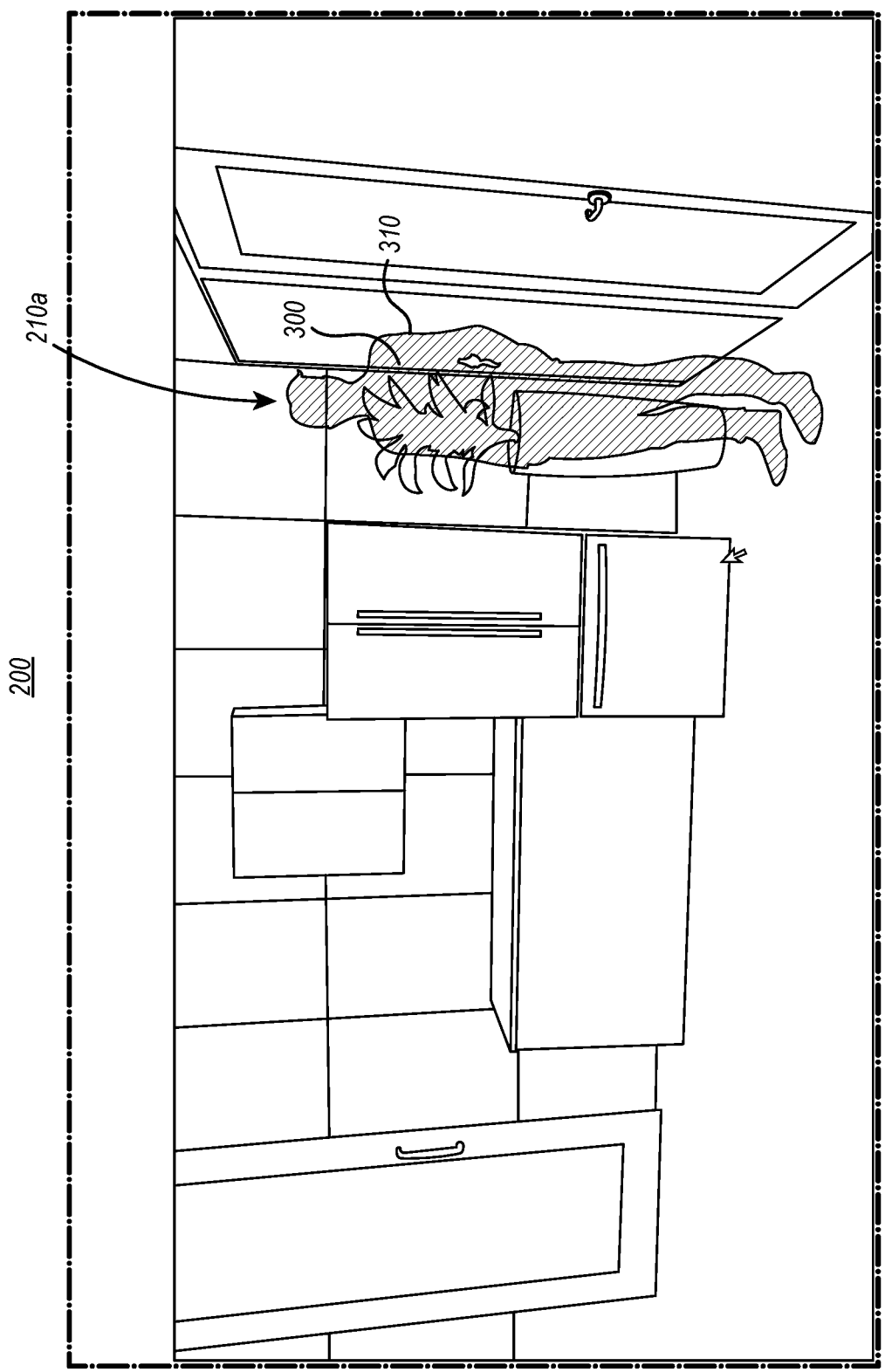
FIG. 3 illustrates a 3D view of an environment, in which an animated character is rendered as a semi-transparent silhouette.

FIGS. 2-8 illustrate various examples of GUIs configured to allow a user to change one or more properties of a silhouette. FIG. 2 illustrates a 3D view of an environment 200 in which an animated character 210a is rendered as a semi-transparent silhouette having a black outline 220 and filled in with a grey color 230. Because the character is an animated character 210a, the pose of the character may vary with time as the character moves within the environment 200. FIG. 3 illustrates additional 3D views of the same environment 200 in which the same animated character 210a is rendered as a semi-transparent silhouette having a different pose, a different colored outline 310, and filled with a different color 300. Notably, the silhouettes in FIGS. 2 and 3 are in a no-shadow mode, (i.e., no shadow of the silhouettes is rendered in the 3D space) and a no-sketch mode (i.e., no sketch lines are rendered inside the silhouettes).

Figure 4:
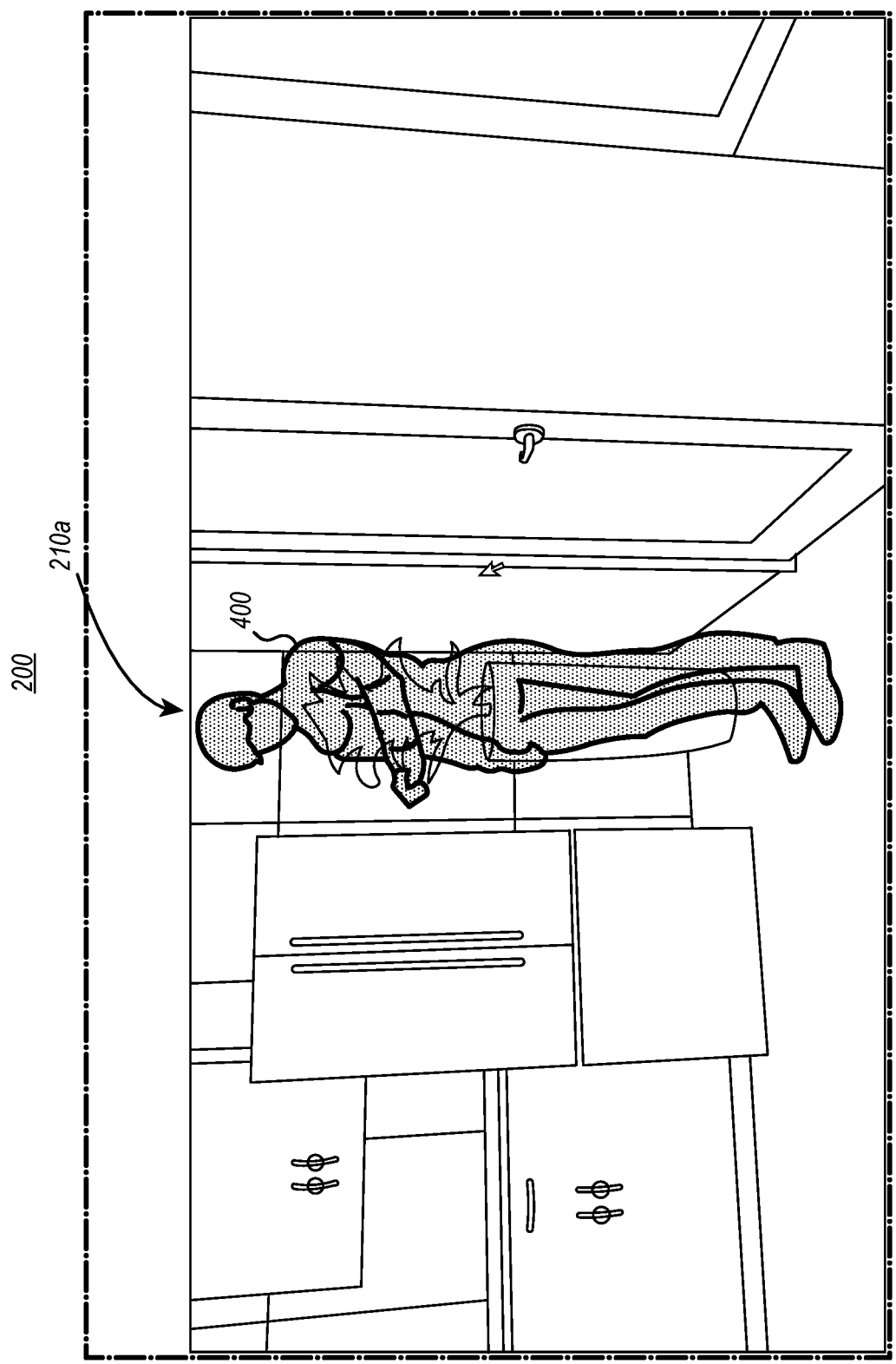
FIG. 4 illustrates a 3D view of an environment, in which an animated character is rendered as a semi-transparent silhouette in sketch mode.

FIG. 4 illustrate additional 3D views of the same environment 200, in which the same animated character 210a is rendered as a semi-transparent silhouette in a sketch mode 400. As illustrated, in the sketch mode 400, the silhouettes not only have an outline that outlines the border of the silhouettes, but also include sketch lines added therein. This mode may be beneficial in renderings that have a large number of background items in order to clearly distinguish the location and position of the animated character 210a in order to accurately provide relative dimensions of the rendered space.

Figure 5:
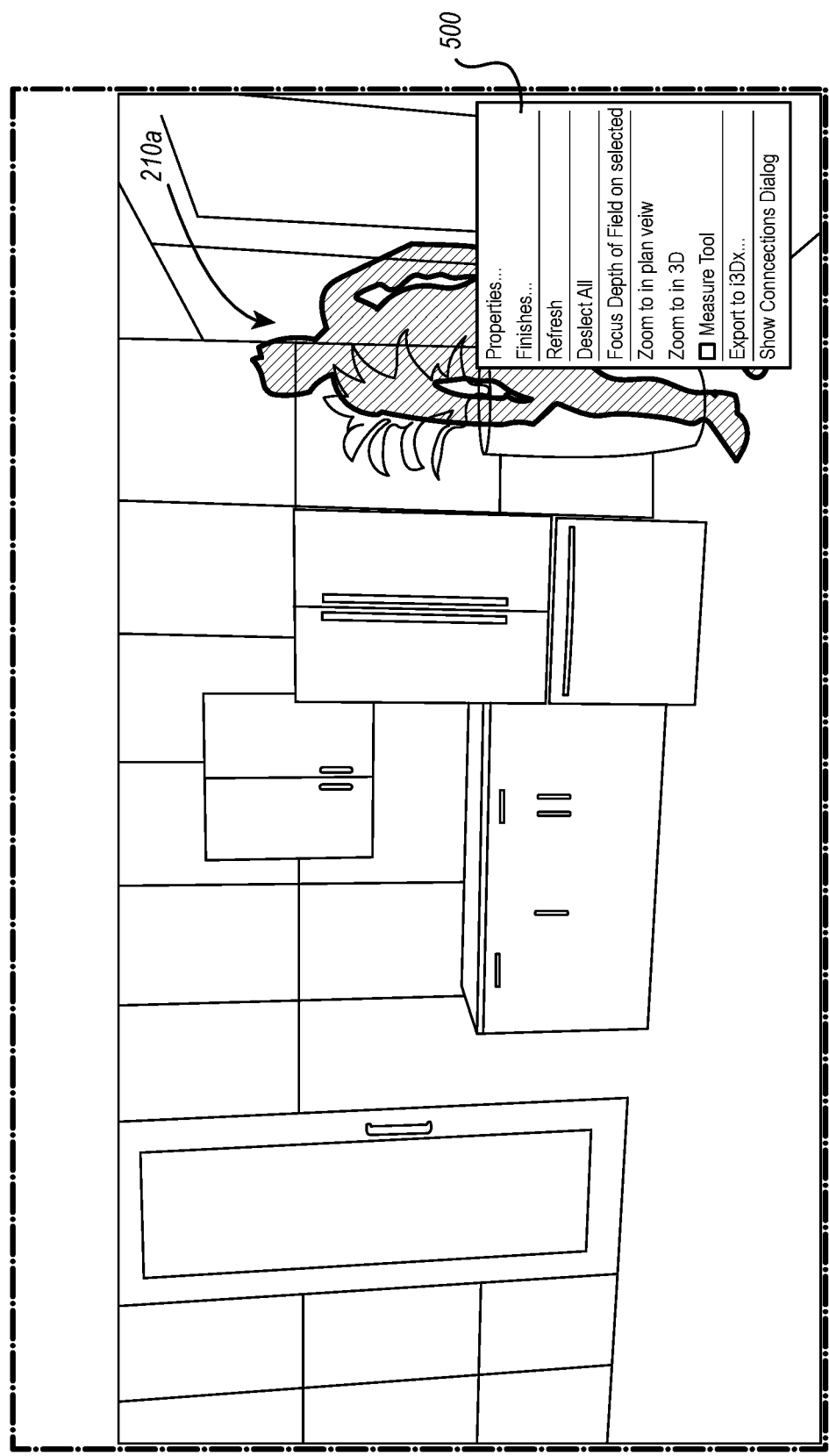
FIG. 5 illustrates a 3D view of an environment, in which an animated character is rendered as a semi-transparent silhouette in sketch mode with a pop-up menu.

FIG. 5 illustrates a pop-up menu 500 displayed next to a silhouette of the same animated character 210a, which may be triggered by double-clicking or right-clicking the silhouette, and/or interacting with other control elements in the GUI, and/or via typed-in commands or quick access keys. The pop-up menu 500 includes a number of control elements that a user can select, including (but not limited to) properties, finishes, refresh, deselect all, focus depth of field on select, zoom to in plane view, zoom to in 3D, measure tool, export to i3Dx, show connections dialog, etc. When the user selects the properties control element, properties settings are presented to the user, and the user can make changes to those properties settings.

Similarly, in at least one embodiment, a GUI of properties and finishes editor may be displayed within the software application. For example, a properties and finishes editor may allow a user to modify the properties of an individual silhouette or all of the silhouettes. Accordingly, the silhouettes can be customized individually or as a group. The user can select a silhouette mode or a full 3D mode. When the silhouette mode is selected, the character in the 3D space is displayed as a silhouette; and when the silhouette mode is not selected, the character in the 3D space is displayed as a regular 3D object. Further, the user can also modify the opacity of the silhouette. Additionally, the user can select whether a shadow or an outline is to be rendered. Finally, when the outline is to be rendered, the user can also select the color of the outline. Additionally, embodiments may provide a color selector as a pop-up window that allows a user to select any desired color for filling the silhouette or the outline of the silhouette.

Figure 6:
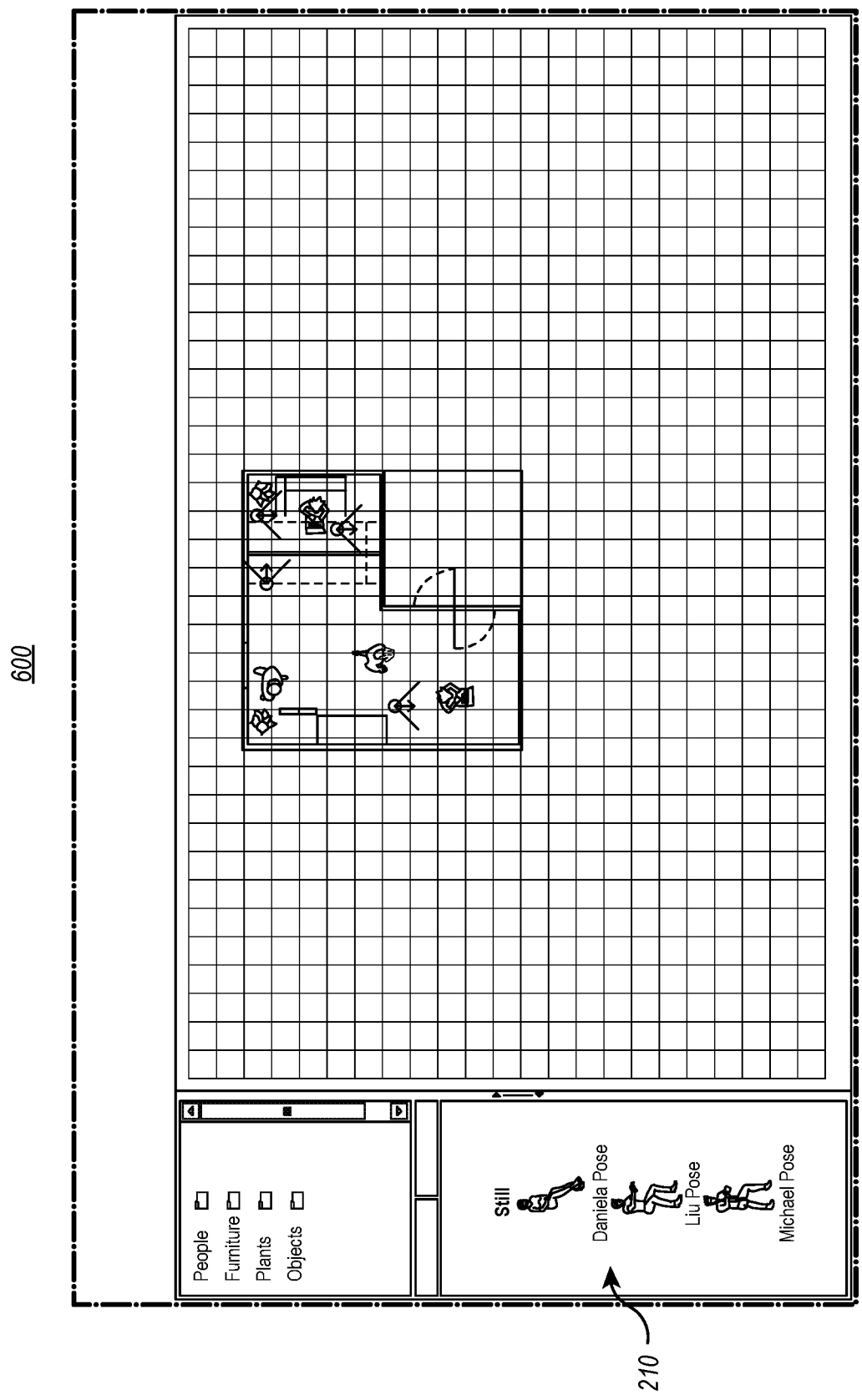
FIG. 6 illustrates an example of a GUI showing a top 2D view of the 3D space and a number of selectable 3D characters that may be placed in the 3D space.

FIG. 6 illustrates a GUI 600 showing a top view of the 3D space 200. On the left of the GUI 600, a user can select different 3D characters 210 and place a selected character 210 at a particular location in the 3D space. In at least one embodiment, each of the different 3D characters 210 may be associated with characteristics, such as virtual height, that a designer is able to select from to accurately depict the scale of the design when rendered. In some embodiments, after a 3D character 210 is placed in the 3D space 200, the 3D character 210 is displayed in the full 3D mode, and a user can change the display of the 3D character 210 from the full 3D mode to the silhouette mode.

Figure 7:
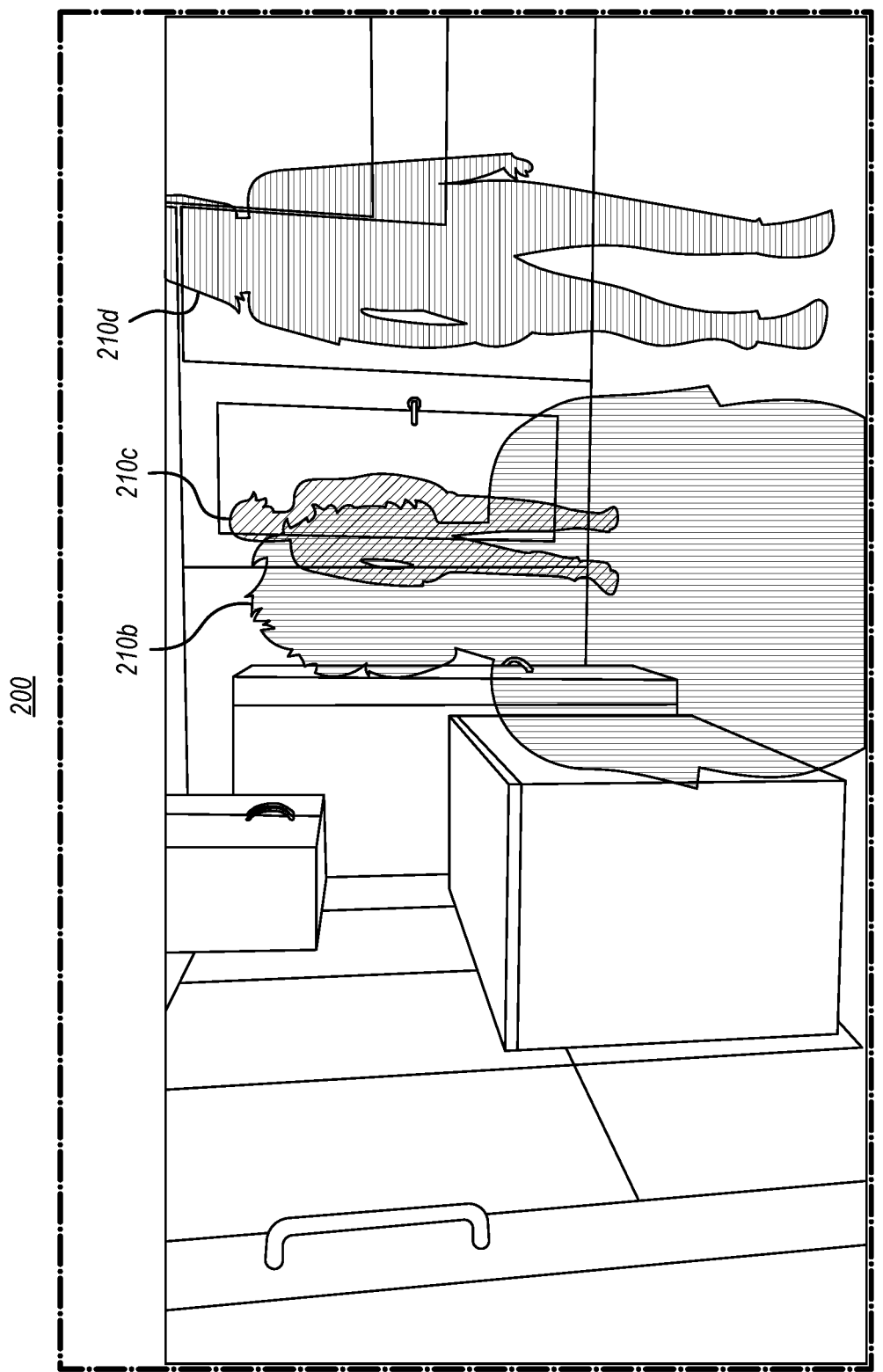
FIG. 7 illustrates a 3D view of an environment, in which multiple animated characters are rendered as semi-transparent silhouettes.

FIG. 7 further illustrates that multiple 3D characters 210b, 210c, 210d in the form of semi-transparent silhouettes may be displayed in the same 3D space. When two of the silhouettes of 3D characters 210b, 210c partially overlap each other, the overlapping area is rendered based on color blending (such as, but not limited to alpha blending), such that none of the two silhouettes completely blocks any feature of the design in the 3D space, and all the features of the design in the 3D space can be at least partially seen through the two silhouettes.

Figure 8:
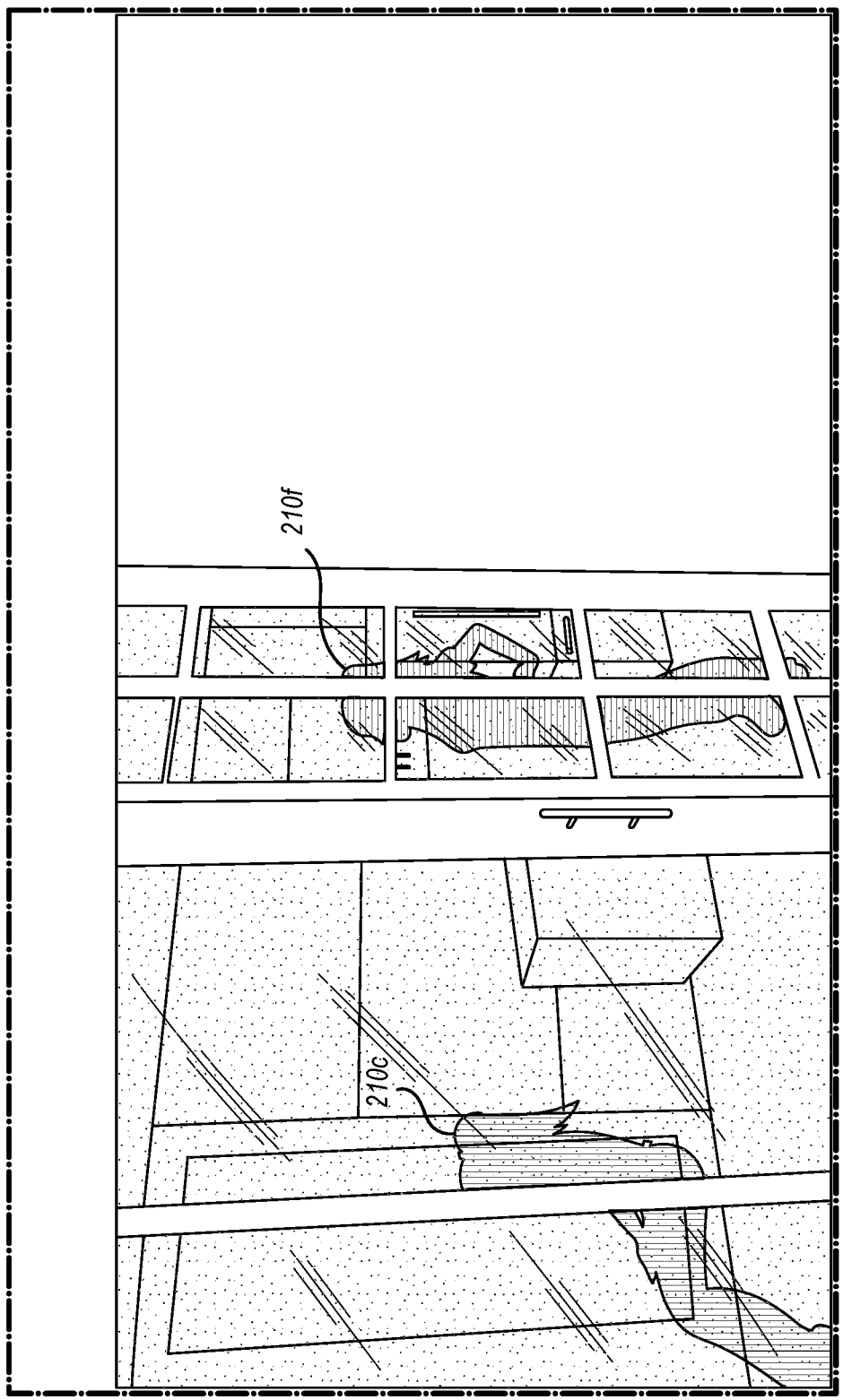
FIG. 8 illustrates a 3D view of an environment, in which multiple animated characters are rendered as semi-transparent silhouettes behind semi-transparent glass.

FIG. 8 illustrates that 3D characters 210c, 210f may be positioned behind a semi-transparent material 800 within a 3D view of an environment 200. The 3D characters 210c, 210f may comprise silhouettes that are colored and of varying degrees of transparency, outlines that are colored or uncolored, a sketch mode, or any number of other characteristics disclosed herein. Viewing the 3D characters 210c, 210f through the semi-transparent material 800 allows a viewer to have a greater appreciation for the opacity of the semi-transparent material and the general scale of the environment 200 without the distraction or rendering burden of depicting a full life-like view of a human.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 9:
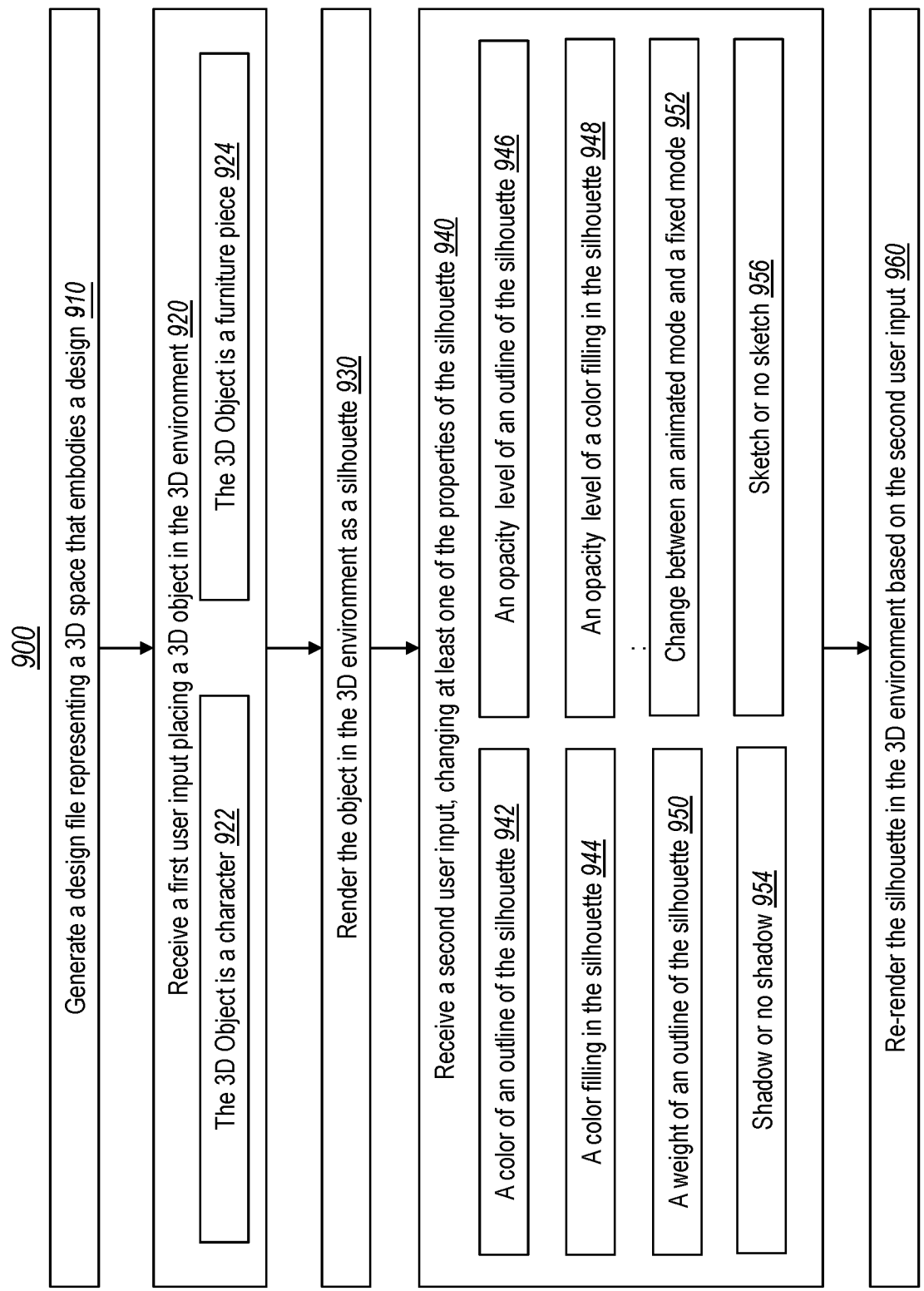
FIG. 9 illustrates a flowchart of a method for rendering a 3D object as a silhouette in a 3D space.

FIG. 9 illustrates a flowchart of an example method 900 for rendering a 3D object as a silhouette in a 3D space. The method 900 includes generating a design file representing a 3D space (act 910). The method 900 further includes receiving a first user input placing a 3D object in the 3D space (act 920). The first user input may include placing a 3D character in the 3D space (act 922) and/or placing a 3D furniture piece in the 3D space (act 924). In response to receiving the first user input, the object is placed in the 3D space as a silhouette (act 930).

Each of the silhouettes rendered in the 3D space includes a set of properties. In some embodiments, the method 900 further includes receiving a second user input, changing at least one of the set of properties of the silhouette (act 940). The second user input may include an input that (1) changes a color of an outline of the silhouette (act 942), (2) changes a color filling in the silhouette (act 944), (3) changes a weight of an outline of the silhouette (act 950), (4) adds a shadow or remove a shadow of the silhouette (act 952), (5) changes an opacity level of an outline of the silhouette (act 946), (6) change an opacity level of a color filling in the silhouette (act 948), (7) changes the silhouette between an animated mode or a fixed mode (act 954), and/or (8) adds or remove sketch lines inside the silhouette (act 956). Finally, in response to the second user input, the silhouette is re-rendered in the 3D space based on the updated properties (act 960).

Finally, because the principles described herein may be performed in the context of a computing system (for example, the CAD software is stored and executed in a computing system) some introductory discussion of a computing system will be described with respect to FIG. 10.

Computing systems are now increasingly taking a wide variety of forms. Computing systems may, for example, be handheld devices, appliances, laptop computers, desktop computers, mainframes, distributed computing systems, data centers, or even devices that have not conventionally been considered a computing system, such as wearables (e.g., glasses). In this description and in the claims, the term "computing system" is defined broadly as including any device or system (or a combination thereof) that includes at least one physical and tangible processor, and a physical and tangible memory capable of having thereon computer-executable instructions that may be executed by a processor. The memory may take any form and may depend on the nature and form of the computing system. A computing system may be distributed over a network environment and may include multiple constituent computing systems.

Figure 10:
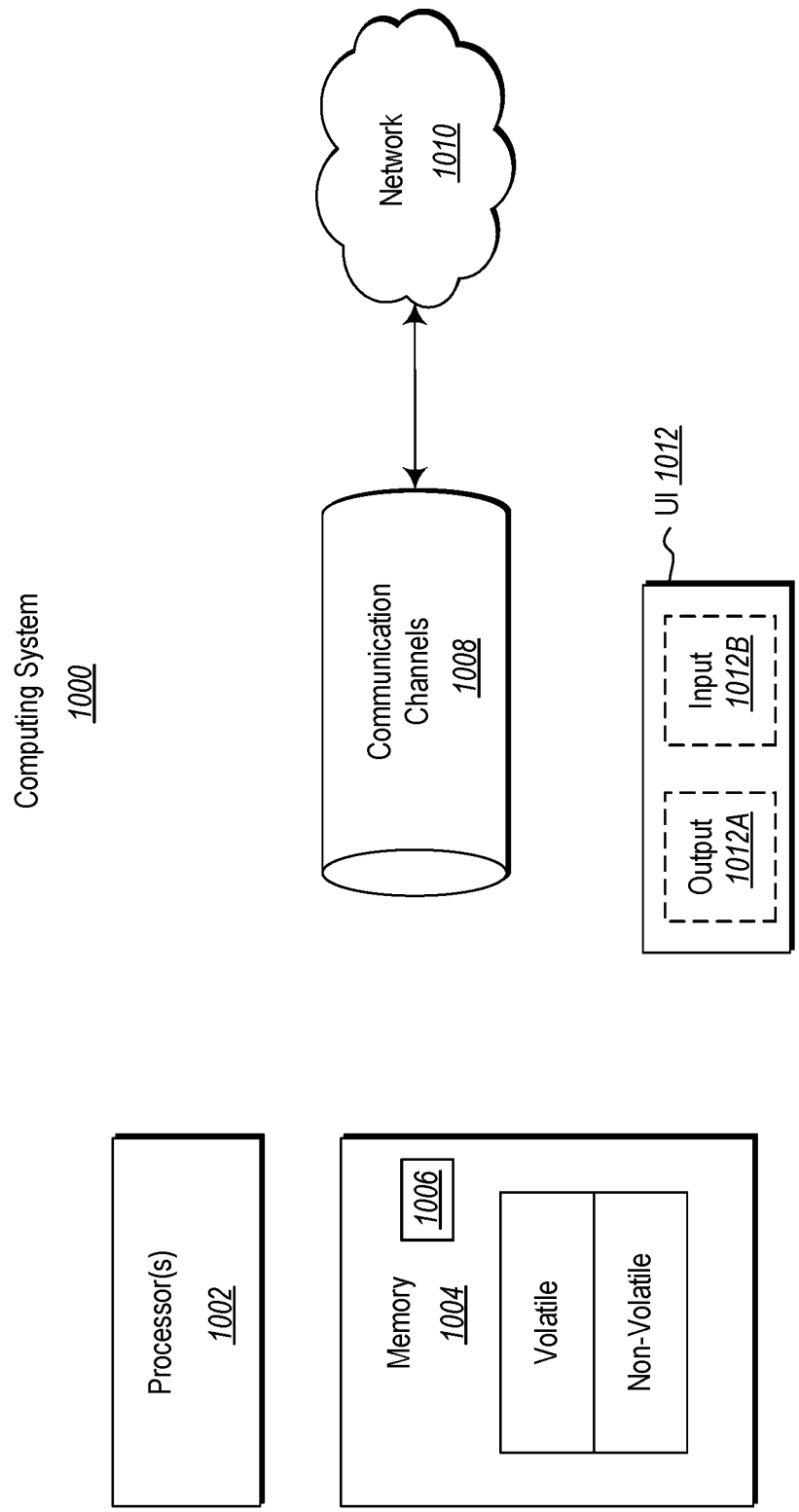
FIG. 10 illustrates an example computing system in which the principles described herein may be employed.

As illustrated in FIG. 10, in its most basic configuration, a computing system 1000 typically includes at least one hardware processing unit 1002 and memory 1004. The processing unit 1002 may include a general-purpose processor and may also include a field-programmable gate array (FPGA), an application-specific integrated circuit (ASIC), or any other specialized circuit. The memory 1004 may be physical system memory, which may be volatile, non-volatile, or some combination of the two. The term "memory" may also be used herein to refer to non-volatile mass storage such as physical storage media. If the computing system is distributed, the processing, memory and/or storage capability may be distributed as well.

The computing system 1000 also has thereon multiple structures often referred to as an "executable component". For instance, memory 1004 of the computing system 1000 is illustrated as including executable component 1006. The term "executable component" is the name for a structure that is well understood to one of ordinary skill in the art in the field of computing as being a structure that can be software, hardware, or a combination thereof. For instance, when implemented in software, one of ordinary skill in the art would understand that the structure of an executable component may include software objects, routines, methods, and so forth, that may be executed on the computing system, whether such an executable component exists in the heap of a computing system, or whether the executable component exists on computer-readable storage media.

In such a case, one of ordinary skill in the art will recognize that the structure of the executable component exists on a computer-readable medium such that, when interpreted by one or more processors of a computing system (e.g., by a processor thread), the computing system is caused to perform a function. Such a structure may be computer-readable directly by the processors (as is the case if the executable component were binary). Alternatively, the structure may be structured to be interpretable and/or compiled (whether in a single stage or in multiple stages) so as to generate such binary that is directly interpretable by the processors. Such an understanding of example structures of an executable component is well within the understanding of one of ordinary skill in the art of computing when using the term "executable component".

The term "executable component" is also well understood by one of ordinary skill as including structures, such as hardcoded or hard-wired logic gates, that are implemented exclusively or near-exclusively in hardware, such as within a field-programmable gate array (FPGA), an application-specific integrated circuit (ASIC), or any other specialized circuit. Accordingly, the term "executable component" is a term for a structure that is well understood by those of ordinary skill in the art of computing, whether implemented in software, hardware, or a combination. In this description, the terms "component", "agent", "manager", "service", "engine", "module", "virtual machine" or the like may also be used. As used in this description and in the case, these terms (whether expressed with or without a modifying clause) are also intended to be synonymous with the term "executable component", and thus also have a structure that is well understood by those of ordinary skill in the art of computing.

In the description above, embodiments are described with reference to acts that are performed by one or more computing systems. If such acts are implemented in software, one or more processors (of the associated computing system that performs the act) direct the operation of the computing system in response to having executed computer-executable instructions that constitute an executable component. For example, such computer-executable instructions may be embodied in one or more computer-readable media that form a computer program product. An example of such an operation involves the manipulation of data. If such acts are implemented exclusively or near-exclusively in hardware, such as within an FPGA or an ASIC, the computer-executable instructions may be hardcoded or hard-wired logic gates. The computer-executable instructions (and the manipulated data) may be stored in the memory 1004 of the computing system 1000. Computing system 1000 may also contain communication channels 1008 that allow the computing system 1000 to communicate with other computing systems over, for example, network 1010.

While not all computing systems require a user interface, in some embodiments, the computing system 1000 includes a user interface system 1012 for use in interfacing with a user. The user interface system 1012 may include output mechanisms 1012A as well as input mechanisms 1012B. The principles described herein are not limited to the precise output mechanisms 1012A or input mechanisms 1012B as such will depend on the nature of the device. However, output mechanisms 1012A might include, for instance, speakers, displays, tactile output, holograms and so forth. Examples of input mechanisms 1012B might include, for instance, microphones, touchscreens, holograms, cameras, keyboards, mouse or other pointer input, sensors of any type, and so forth.

Embodiments described herein may comprise or utilize a special purpose or general-purpose computing system including computer hardware, such as, for example, one or more processors and system memory, as discussed in greater detail below. Embodiments described herein also include physical and other computer-readable media for carrying or storing computer-executable instructions and/or data structures. Such computer-readable media can be any available media that can be accessed by a general-purpose or special purpose computing system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: storage media and transmission media.

Computer-readable storage media includes RAM, ROM, EEPROM, CD-ROM, or other optical disk storage, magnetic disk storage, or other magnetic storage devices, or any other physical and tangible storage medium which can be used to store desired program code means in the form of computer-executable instructions or data structures and which can be accessed by a general-purpose or special purpose computing system.

A "network" is defined as one or more data links that enable the transport of electronic data between computing systems and/or modules and/or other electronic devices. When information is transferred or provided over a network or another communications connection (either hardwired, wireless, or a combination of hardwired or wireless) to a computing system, the computing system properly views the connection as a transmission medium. Transmissions media can include a network and/or data links which can be used to carry desired program code means in the form of computer-executable instructions or data structures and which can be accessed by a general-purpose or special-purpose computing system. Combinations of the above should also be included within the scope of computer-readable media.

Further, upon reaching various computing system components, program code means in the form of computer-executable instructions or data structures can be transferred automatically from transmission media to storage media (or vice versa). For example, computer-executable instructions or data structures received over a network or data link can be buffered in RAM within a network interface module (e.g., a "NIC"), and then eventually transferred to computing system RAM and/or to less volatile storage media at a computing system. Thus, it should be understood that storage media can be included in computing system components that also (or even primarily) utilize transmission media.

Computer-executable instructions comprise, for example, instructions and data which, when executed at a processor, cause a general-purpose computing system, special purpose computing system, or special purpose processing device to perform a certain function or group of functions. Alternatively or in addition, the computer-executable instructions may configure the computing system to perform a certain function or group of functions. The computer executable instructions may be, for example, binaries or even instructions that undergo some translation (such as compilation) before direct execution by the processors, such as intermediate format instructions such as assembly language, or even source code.

Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computing system configurations, including, personal computers, desktop computers, laptop computers, message processors, handheld devices, multi-processor systems, microprocessor-based or programmable consumer electronics, network PCs, minicomputers, mainframe computers, mobile telephones, PDAs, pagers, routers, switches, data centers, wearables (such as glasses) and the like. The invention may also be practiced in distributed system environments where local and remote computing system, which are linked (either by hardwired data links, wireless data links, or by a combination of hardwired and wireless data links) through a network, both perform tasks. In a distributed system environment, program modules may be located in both local and remote memory storage devices.

Those skilled in the art will also appreciate that the invention may be practiced in a cloud computing environment. Cloud computing environments may be distributed, although this is not required. When distributed, cloud computing environments may be distributed internationally within an organization and/or may have components possessed across multiple organizations. In this description and the following claims, "cloud computing" is defined as a model for enabling on-demand network access to a shared pool of configurable computing resources (e.g., networks, servers, storage, applications, and services). The definition of "cloud computing" is not limited to any of the other numerous advantages that can be obtained from such a model when properly deployed.

The remaining figures may discuss various computing system which may correspond to the computing system 1000 previously described. The computing systems of the remaining figures include various components or functional blocks that may implement the various embodiments disclosed herein as will be explained. The various components or functional blocks may be implemented on a local computing system or may be implemented on a distributed computing system that includes elements resident in the cloud or that implement aspect of cloud computing. The various components or functional blocks may be implemented as software, hardware, or a combination of software and hardware. The computing systems of the remaining figures may include more or less than the components illustrated in the figures and some of the components may be combined as circumstances warrant. Although not necessarily illustrated, the various components of the computing systems may access and/or utilize a processor and memory, such as processor 1002 and memory 1004, as needed to perform their various functions.

For the processes and methods disclosed herein, the operations performed in the processes and methods may be implemented in differing order. Furthermore, the outlined operations are only provided as examples, and some of the operations may be optional, combined into fewer steps and operations, supplemented with further operations, or expanded into additional operations without detracting from the essence of the disclosed embodiments.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A computing system comprising:
   one or more processors; and
   one or more computer-readable media having stored thereon a computer-aided design software including computer-executable instructions that are structured such that, when the computer-executable instructions are executed by the one or more processors, configure the computing system to perform at least:
   generate a design file representing a three-dimensional space that embodies a design;
   render a three-dimensional view of the three-dimensional space in a graphical user interface;
   receive a first user input of placing a three-dimensional object in the three-dimensional space;
   while the three-dimensional space is rendered in the three-dimensional view, render the three-dimensional object in the three-dimensional space as a silhouette;

wherein the silhouette is rendered as a semi-transparent silhouette having a particular opacity level;
render the three-dimensional object as the semi-transparent silhouette includes performing color blending to combine a color of the silhouette with colors of an area of the three-dimensional view of the three-dimensional space that overlaps the silhouette to create an appearance of partial or full transparency, such that the silhouette does not completely block any feature of the design in the three-dimensional space, and such that features of the design in the three-dimensional space can be at least partially seen through the silhouette,
wherein the silhouette is a first silhouette;
receive a second user input to place a second object in the three-dimensional space;
render the second object in the three-dimensional view of the three-dimensional space as a second silhouette that is also semi-transparent; and
when the second silhouette at least partially overlaps the first silhouette in the three-dimensional view, perform color blending in an overlapping area among the first silhouette, the second silhouette, and the three-dimensional space to create an appearance of partial or full transparency, such that neither the first silhouette, nor the second silhouette completely blocks any feature of the design in the three-dimensional space, and such that all features of the design in the three-dimensional space can be at least partially seen through the first silhouette and the second silhouette.

2. The computing system of claim 1, wherein the three-dimensional object is a character.

3. The computing system of claim 1, wherein the three-dimensional object is a fixture or a non-fixture.

4. The computing system of claim 1, wherein the computing system is further configured to:
receive a second user input, changing at least one of a plurality of properties of the silhouette; and
re-render the three-dimensional object in the three-dimensional view of the three-dimensional space based on the second user input.

5. The computing system of claim 4, wherein the plurality of properties of the silhouette includes a color of an outline of the silhouette.

6. The computing system of claim 4, wherein the plurality of properties of the silhouette includes a weight of an outline of the silhouette.

7. The computing system of claim 4, wherein the plurality of properties of the silhouette includes a color filling in the silhouette.

8. The computing system of claim 4, wherein the plurality of properties of the silhouette includes an opacity level of an outline of the silhouette.

9. The computing system of claim 4, wherein the plurality of properties of the silhouette includes an opacity level of a color filling in the silhouette.

10. The computing system of claim 4, wherein the plurality of properties of the silhouette includes a shadow property configured to set the silhouette in a shadow mode or a no-shadow mode;
when the silhouette is in the shadow mode, a shadow of the silhouette is rendered based on lighting and depth of each surface in the three-dimensional view; and
when the silhouette is in the no-shadow mode, no shadow of the silhouette is rendered.

11. The computing system of claim 4, wherein:
the plurality of properties of the silhouette includes an animation property that is configured to set the silhouette to an animated mode or fixed mode;
when the silhouette is in the animated mode, the silhouette is an animated silhouette configured to perform a sequence of motions; and
when the silhouette is in the fixed mode, the silhouette is fixed at a particular position in the three-dimensional view of the three-dimensional space, holding still.

12. The computing system of claim 11, wherein the sequence of motions is a predetermined sequence of motions.

13. The computing system of claim 11, wherein the computing system is further configured to receive sensing data from one or more sensors attached to a user, and the sequence of motions is configured to mimic motions of the user based on the sensing data.

14. The computing system of claim 4, wherein:
the plurality of properties of the silhouette includes a sketch property that is configured to set the silhouette to a sketch mode or no-sketch mode;
when the silhouette is in the sketch mode, the silhouette is rendered to sketch lines inside the silhouette and an outline outlining the silhouette based on a shape of the three-dimensional object and a setting of lighting in the three-dimensional view of the three-dimensional space; and
when the silhouette is in the no-sketch mode, the silhouette is rendered to have no sketch lines inside the silhouette.

15. A method for rendering a 3D object as a silhouette in a 3D space, the method comprising:
generating a design file representing a three-dimensional space that embodies a design;
rendering a three-dimensional view of the three-dimensional space in a graphical user interface;
receiving a first user input of placing a three-dimensional object in the three-dimensional space;
while the three-dimensional space is rendered in the three-dimensional view, rendering the three-dimensional object in the three-dimensional space as a silhouette;
receiving a second user input to place a second object in the three-dimensional space;
rendering the second object in the three-dimensional view of the three-dimensional space as a second silhouette that is also semi-transparent; and
when the second silhouette at least partially overlaps the silhouette in the three-dimensional view, perform color blending in an overlapping area among the silhouette, the second silhouette, and the three-dimensional space to create an appearance of partial or full transparency, such that neither the silhouette, nor the second silhouette completely blocks any feature of the design in the three-dimensional space, and such that all features of the design in the three-dimensional space can be at least partially seen through the silhouette and the second silhouette.

16. The method of claim 15, wherein:
the silhouette is rendered as a semi-transparent silhouette; and
rendering the three-dimensional object as the semi-transparent silhouette includes performing color blending to combine a color of the silhouette with colors of an area of the three-dimensional view of the three-dimensional space that overlaps the silhouette to create an appearance of partial or full transparency, such that the silhouette does not completely block any feature of the design in the three-dimensional space, and such that all features of the design in the three-dimensional space can be at least partially seen through the silhouette.

\* \* \* \* \*